United States Patent
Rong et al.

(10) Patent No.: US 9,726,351 B2
(45) Date of Patent: Aug. 8, 2017

(54) LIGHT EMITTING ASSEMBLY WITH SPECTRUM-SHIFTING REFLECTANCE AND METHOD

(71) Applicant: Dow Corning Corporation, Midland, MI (US)

(72) Inventors: Wei Rong, Midland, MI (US); Michael Raymond Strong, Midland, MI (US)

(73) Assignee: DOW CORNING CORPORATION, Midland, MI (US)

( * ) Notice: Subject to any disclaimer, the term of this patent is extended or adjusted under 35 U.S.C. 154(b) by 0 days.

(21) Appl. No.: 14/783,443

(22) PCT Filed: Apr. 9, 2014

(86) PCT No.: PCT/US2014/033494
§ 371 (c)(1),
(2) Date: Oct. 9, 2015

(87) PCT Pub. No.: WO2014/172162
PCT Pub. Date: Oct. 23, 2014

(65) Prior Publication Data
US 2016/0076741 A1    Mar. 17, 2016

Related U.S. Application Data

(60) Provisional application No. 61/811,914, filed on Apr. 15, 2013.

(51) Int. Cl.
*F21V 13/14*     (2006.01)
*F21V 7/00*      (2006.01)
(Continued)

(52) U.S. Cl.
CPC ............ *F21V 13/14* (2013.01); *F21K 9/62* (2016.08); *F21K 9/64* (2016.08); *F21K 9/90* (2013.01);
(Continued)

(58) Field of Classification Search
CPC ...... F21V 13/14; F21V 7/0008; F21V 7/0033; F21V 7/22; F21K 9/64; F21K 9/62
See application file for complete search history.

(56) References Cited

U.S. PATENT DOCUMENTS 7,703,945 B2 *  4/2010  Leung ............... F21V 7/0008
                                                    257/98
8,475,009 B2 *  7/2013  Brennan .............. B64F 1/20
                                                    362/309

(Continued)

FOREIGN PATENT DOCUMENTS

JP    2009076494 A    4/2009
WO   2005/055328 A1  6/2005

OTHER PUBLICATIONS

PCT/US2014/033494 Search Report dated Aug. 25, 2014.

*Primary Examiner* — Julie Bannan
(74) *Attorney, Agent, or Firm* — Matthew T. Fewkes

(57) ABSTRACT

A light emitting assembly and method for making optionally includes a light source configured to emit light substantially about a plane, the light having a first spectral profile, and a material configured to shift light incident from the light source from the first spectral profile to a second spectral profile and emit light as shifted. The light, as shifted, is emitted from the assembly generally along an axis orthogonal to the plane.

12 Claims, 6 Drawing Sheets

(51) Int. Cl.

| | | |
|---|---|---|
| *F21V 7/22* | (2006.01) | |
| *H01L 33/58* | (2010.01) | |
| *G02B 19/00* | (2006.01) | |
| *F21V 29/70* | (2015.01) | |
| *F21K 9/90* | (2016.01) | |
| *F21V 9/16* | (2006.01) | |
| *F21K 9/62* | (2016.01) | |
| *F21K 9/64* | (2016.01) | |
| *H01L 33/50* | (2010.01) | |
| *F21Y 115/10* | (2016.01) | |

(52) U.S. Cl.
CPC .......... *F21V 7/0008* (2013.01); *F21V 7/0033* (2013.01); *F21V 7/22* (2013.01); *F21V 9/16* (2013.01); *F21V 29/70* (2015.01); *G02B 19/0028* (2013.01); *G02B 19/0061* (2013.01); *H01L 33/58* (2013.01); *F21Y 2115/10* (2016.08); *H01L 33/505* (2013.01)

(56) References Cited

U.S. PATENT DOCUMENTS

2006/0268555 A1* 11/2006 Kelly .................... F21L 14/023
362/341
2013/0308338 A1* 11/2013 Lin ........................... F21V 9/16
362/609

\* cited by examiner

LIGHT EMITTING ASSEMBLY WITH SPECTRUM-SHIFTING REFLECTANCE AND METHOD

CROSS REFERENCE TO RELATED APPLICATIONS

This application claims the benefit of priority to PCT International Patent Application Number PCT/US14/033494 filed Apr. 9, 2014, and to U.S. Provisional Patent Application Ser. No. 61/811,914, filed Apr. 15, 2013, each disclosure of which is incorporated herein in its entirety by reference.

FIELD

This disclosure generally relates to a light emitting assembly with a light source emitting light generally about a plane and a spectrum shifter emitting light generally along an axis orthogonal to the plane and method therefor.

BACKGROUND

Light emitting assemblies, such as light bulbs, lamps, luminaires, flashlights, data transmitters, and the like, may conventionally incorporate a light emitter that emits light having a first spectral profile. The assembly may then incorporate a spectral-profile-shifting material configured to shift the spectral profile of incident light to a second spectral characteristic and re-emit the light. Such material may be or include a phosphor. Thus, conventionally, a light emitter such as a light emitting diode (LED) may emit light having a generally blue or ultraviolet spectrum. The light as emitted from the light emitter may then pass through the spectral-profile-shifting material and be emitted from the assembly as another spectrum with a lengthened wavelength, such as green, yellow, or red. After mixing with excited and emitted light, the assembly delivers white light or a color approximating white light.

SUMMARY

In Example 1, a light emitting assembly incorporates a light source configured to emit light substantially about a plane, the light having a first spectral profile and a material configured to shift light incident from the light source from the first spectral profile to a second spectral profile and emit light as shifted. In one such example, the light, as shifted, is emitted from the assembly generally along an axis orthogonal to the plane.

In Example 2, the light emitting assembly of Example 1 optionally further includes that the light source comprises a light emitter configured to emit the light and a lens configured to direct the light as emitted by the light emitter substantially about the plane.

In Example 3, the light emitting assembly of any one or more of Examples 1 and 2 optionally further includes that the light emitter is a hemisphere-emitting light emitting diode (LED).

In Example 4, the light emitting assembly of any one or more of Examples 1-3 optionally further includes that the light source is a side light emitter with respect to the axis.

In Example 5, the light emitting assembly of any one or more of Examples 1-4 optionally further includes that the light source comprises a light emitter configured to emit the light and a reflector configured to re-direct the light as emitted by the light emitter substantially about the plane.

In Example 6, the light emitting assembly of any one or more of Examples 1-5 optionally further includes that the material is a phosphor.

In Example 7, the light emitting assembly of any one or more of Examples 1-6 optionally further includes that the material is contained within a silicone composition.

In Example 8, the light emitting assembly of any one or more of Examples 1-7 optionally further includes that the material forms a layer that substantially encircles the light source about the plane.

In Example 9, the light emitting assembly of any one or more of Examples 1-8 optionally further includes a reflective surface in substantial contact with and distal to the material relative to the light source, wherein the reflective surface is configured to reflect the light as shifted by the material along the axis.

In Example 10, the light emitting assembly of any one or more of Examples 1-9 optionally further includes that the material is further configured to reflect light as shifted along the axis.

In Example 11, the light emitting assembly of any one or more of Examples 1-10 optionally further includes that the material is a spectrum-shifting material, and further includes a housing formed from a housing material having a thermal conductivity greater than that of the spectrum-shifting material and configured to conduct heat energy from the spectrum-shifting material.

In Example 12, the light emitting assembly of any one or more of Examples 1-11 optionally further includes that the housing is formed from at least one of a metal and a filled silicone.

In Example 13, the light emitting assembly of any one or more of Examples 1-12 optionally further includes that the reflective surface is a part of the housing.

In Example 14, the light emitting assembly of any one or more of Examples 1-13 optionally further includes a heat sink thermally coupled to the housing and configured to dissipate, at least in part, heat from the housing and the spectrum-shifting material.

In Example 15, the light emitting assembly of any one or more of Examples 1-14 optionally further includes that the heat sink has a thermal conductivity different than the thermal conductivity of the housing, and further includes a thermal interface material thermally coupled between the housing and the heat sink, the thermal interface configured to reduce a thermal resistance between the housing and the heat sink.

In Example 16, a method for making a light emitting assembly includes forming a light source configured to emit light substantially about a plane, the light having a first spectral profile, and forming a spectrum-shifting material with respect to the light source, the spectrum-shifting material being configured to shift light incident from the light source from the first spectral profile to a second spectral profile and emit light as shifted. The light, as shifted, is emitted from the assembly generally along an axis orthogonal to the plane.

In Example 17, the method of Example 16 optionally further includes that forming the light source comprises positioning a light emitter configured to emit the light with respect to a lens configured to direct the light as emitted by the light emitter substantially about the plane.

In Example 18, the method of any one or more of Examples 16 and 17 optionally further includes that the light emitter is a hemisphere-emitting light emitting diode (LED).

In Example 19, the method of any one or more of Examples 16-18 optionally further includes that the light source is a side light emitter with respect to the axis.

In Example 20, the method of any one or more of Examples 16-19 optionally further includes that forming the light source comprises positioning a light emitter configured to emit the light with respect to a reflector configured to re-direct the light as emitted by the light emitter substantially about the plane.

In Example 21, the method of any one or more of Examples 16-20 optionally further includes that the material is a phosphor.

In Example 22, the method of any one or more of Examples 16-21 optionally further includes that forming the material comprises containing the material within a silicone composition In Example 23, the method of any one or more of Examples 16-22 optionally further includes that forming the material comprises forming the material as a layer that substantially encircles the light source about the plane.

In Example 24, the method of any one or more of Examples 16-23 optionally further includes forming a reflective surface in substantial contact with and distal to the material relative to the light source, wherein the reflective surface is configured to reflect the light as shifted by the material along the axis.

In Example 25, the method of any one or more of Examples 16-24 optionally further includes that the material is further configured to reflect light as shifted along the axis.

In Example 26, the method of any one or more of Examples 16-25 optionally further includes forming a housing from a housing material having a thermal conductivity greater than that of the spectrum-shifting material and configured to conduct heat energy from the spectrum-shifting material.

In Example 27, the method of any one or more of Examples 16-26 optionally further includes that the housing is formed from at least one of a metal and a filled silicone.

In Example 28, the method of any one or more of Examples 16-27 optionally further includes that forming the housing comprises forming the reflective surface as a part of the housing.

In Example 29, the method of any one or more of Examples 16-28 optionally further includes positioning a heat sink thermally coupled to the housing and configured to dissipate, at least in part, heat from the housing and the spectrum-shifting material.

In Example 30, the method of any one or more of Examples 16-29 optionally further includes that the heat sink has a thermal conductivity different than the thermal conductivity of the housing, and further includes thermally coupling a thermal interface material between the housing and the heat sink, the thermal interface configured to reduce a thermal resistance between the housing and the heat sink.

In Example 31, a light emitting assembly incorporates a light source oriented on a plane, and configured to emit light substantially away from an axis orthogonal to the plane, the light having a first spectral profile, and a material configured to shift light incident from the light source from the first spectral profile to a second spectral profile and emit light as shifted. In one such example, the light, as shifted, is emitted from the assembly generally along an axis orthogonal to the plane.

In Example 32, the light emitting assembly of Example 31 optionally further includes that the light source comprises a light emitter configured to emit the light and a lens configured to direct the light as emitted by the light emitter substantially about the plane.

In Example 33, the light emitting assembly of any one or more of Examples 31 and 32 optionally further includes that the light emitter is a hemisphere-emitting light emitting diode (LED).

In Example 34, the light emitting assembly of any one or more of Examples 31-33 optionally further includes that the light source is a side light emitter with respect to the axis.

In Example 35, the light emitting assembly of any one or more of Examples 31-34 optionally further includes that the light source comprises a light emitter configured to emit the light and a reflector configured to re-direct the light as emitted by the light emitter substantially about the plane.

In Example 36, the light emitting assembly of any one or more of Examples 31-35 optionally further includes that the material is a phosphor.

In Example 37, the light emitting assembly of any one or more of Examples 31-36 optionally further includes that the material is contained within a silicone composition.

In Example 38, the light emitting assembly of any one or more of Examples 31-37 optionally further includes that the material forms a layer that substantially encircles the light source about the plane.

In Example 39, the light emitting assembly of any one or more of Examples 31-38 optionally further includes a reflective surface in substantial contact with and distal to the material relative to the light source, wherein the reflective surface is configured to reflect the light as shifted by the material along the axis.

In Example 40, the light emitting assembly of any one or more of Examples 31-39 optionally further includes that the material is further configured to reflect light as shifted along the axis.

In Example 41, the light emitting assembly of any one or more of Examples 31-40 optionally further includes that the material is a spectrum-shifting material, and further includes a housing formed from a housing material having a thermal conductivity greater than that of the spectrum-shifting material and configured to conduct heat energy from the spectrum-shifting material.

In Example 42, the light emitting assembly of any one or more of Examples 31-41 optionally further includes that the housing is formed from at least one of a metal and a filled silicone.

In Example 43, the light emitting assembly of any one or more of Examples 31-42 optionally further includes that the reflective surface is a part of the housing.

In Example 44, the light emitting assembly of any one or more of Examples 31-43 optionally further includes a heat sink thermally coupled to the housing and configured to dissipate, at least in part, heat from the housing and the spectrum-shifting material.

In Example 45, the light emitting assembly of any one or more of Examples 31-44 optionally further includes that the heat sink has a thermal conductivity different than the thermal conductivity of the housing, and further includes a thermal interface material thermally coupled between the housing and the heat sink, the thermal interface configured to reduce a thermal resistance between the housing and the heat sink.

In Example 46, a method for making a light emitting assembly includes orienting a light source on a plane, the light source configured to emit light substantially away from an axis orthogonal to the plane, the light having a first spectral profile, and forming a spectrum-shifting material with respect to the light source, the spectrum-shifting material being configured to shift light incident from the light source from the first spectral profile to a second spectral profile and emit light as shifted. The light, as shifted, is emitted from the assembly generally along an axis orthogonal to the plane.

In Example 47, the method of Example 46 optionally further includes that orienting the light source comprises positioning a light emitter configured to emit the light with respect to a lens configured to direct the light as emitted by the light emitter substantially about the plane.

In Example 48, the method of any one or more of Examples 46 and 47 optionally further includes that the light emitter is a hemisphere-emitting light emitting diode (LED).

In Example 49, the method of any one or more of Examples 46-48 optionally further includes that the light source is a side light emitter with respect to the axis.

In Example 50, the method of any one or more of Examples 46-49 optionally further includes that orienting the light source comprises a positioning a light emitter configured to emit the light with respect to a reflector configured to re-direct the light as emitted by the light emitter substantially about the plane.

In Example 51, the method of any one or more of Examples 46-50 optionally further includes that the material is a phosphor.

In Example 52, the method of any one or more of Examples 46-51 optionally further includes that forming the material comprises containing the material within a silicone composition.

In Example 53, the method of any one or more of Examples 46-52 optionally further includes that forming the material comprises forming the material as a layer that substantially encircles the light source about the plane.

In Example 54, the method of any one or more of Examples 46-53 optionally further includes forming a reflective surface in substantial contact with and distal to the material relative to the light source, wherein the reflective surface is configured to reflect the light as shifted by the material along the axis.

In Example 55, the method of any one or more of Examples 46-54 optionally further includes that the material is further configured to reflect light as shifted along the axis.

In Example 56, the method of any one or more of Examples 46-55 optionally further includes forming a housing from a housing material having a thermal conductivity greater than that of the spectrum-shifting material and configured to conduct heat energy from the spectrum-shifting material.

In Example 57, the method of any one or more of Examples 46-56 optionally further includes that the housing is formed from at least one of a metal and a filled silicone.

In Example 58, the method of any one or more of Examples 46-57 optionally further includes that forming the housing comprises forming the reflective surface as a part of the housing.

In Example 59, the method of any one or more of Examples 46-58 optionally further includes positioning a heat sink thermally coupled to the housing and configured to dissipate, at least in part, heat from the housing and the spectrum-shifting material.

In Example 60, the method of any one or more of Examples 46-59 optionally further includes that the heat sink has a thermal conductivity different than the thermal conductivity of the housing, and further including thermally coupling a thermal interface material between the housing and the heat sink, the thermal interface having a thermal conductivity between that of the housing and the heat sink.

FIGURES

DETAILED DESCRIPTION

Light emitting assemblies may conventionally include the spectrum-shifting material as a layer through which the light passes immediately prior to leaving the assembly. The light emitter within the assembly may emit light in a variety of directions and result in internal reflectance within the assembly, such as where the light emitter is an incandescent bulb or a hemispherical LED. However, in such examples the light emitter may also partially or exclusively emit the light along the primary axis upon which the light impacts on the spectrum-shifting material and from there emits out of the assembly. In such examples, the light may not have a spectrum shift arising from the spectrum-shifting material until immediately before the light is emitted from the assembly. Alternatively or additionally, assemblies may rely on complete or essentially complete internal reflectance, with the light emitting no or essentially no light directly to the spectrum-shifting material, instead relying on internal reflectance to orient the light to the spectrum-shifting material and out of the assembly. Alternatively, the spectrum-shifting material may be located not at the point of emitting the light but away from the emitter opening. The spectrum of the light may be shifted, whereupon internal reflectance may cause the light as shifted to be emitted from the assembly.

Examples such as the above structures may result in the spectrum-shifting material either building up undesirably large amounts of heat or may rely on heat dissipating structures internal to the assembly that may be undesirably bulky and/or mechanically complicated. A light emitting assembly has been developed that provides for light at a first spectral profile to be emitted from a light source generally about or along directions within a plane, to be shifted by a spectrum-shifting material, and then to be emitted from the assembly generally along an axis orthogonal to the plane. The light source may include a light emitter and, optionally, a structure configured to direct light emitted by the light emitter along the plane, such as a lens or a reflector. The light source may simply be a light emitter that emits light along the plane without a need for redirection of the light, such as a side light emitter. The spectrum-shifting material may be essentially circumferential around the light source and substantially in contact with a heat dissipating structure. The heat dissipating structure may be or include a housing, a heat sink, and/or other thermally conductive materials. The spectrum-shifting material may directly emit the light as shifted generally along the axis or the light as emitted by the material may be reflected along the axis, such as by a reflective surface of the housing. Because the spectrum-shifting material is in contact with thermally conductive material, the spectrum-shifting material may build up less heat than other designs while still directing light generally along the axis.

Figure 1A:
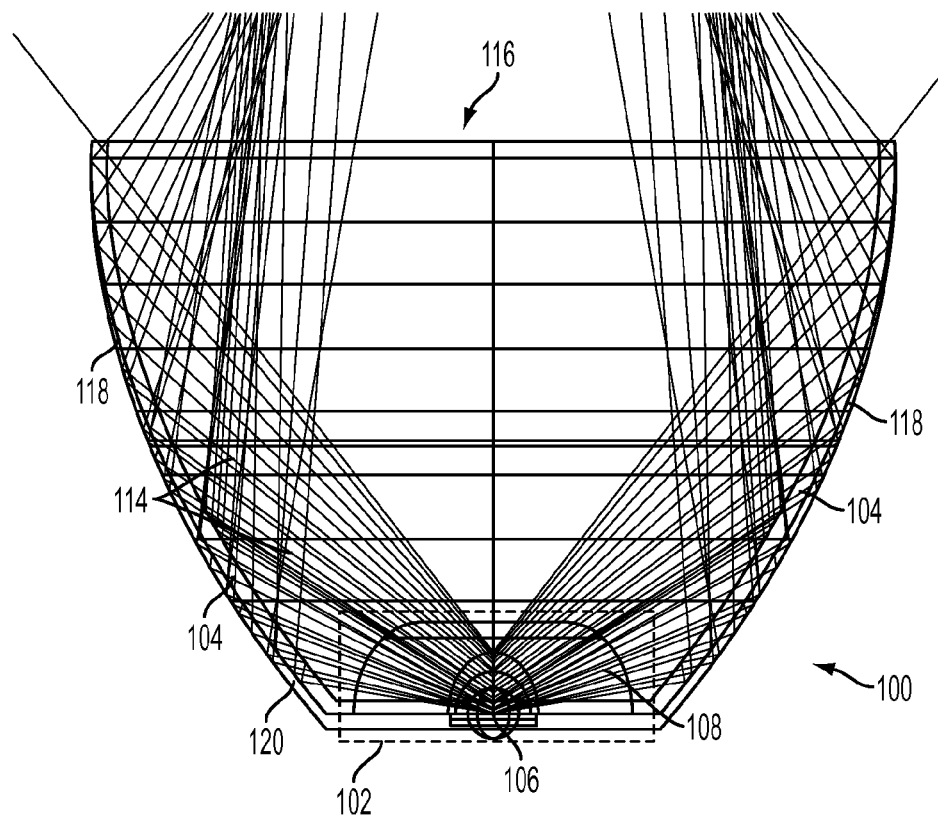
FIGS. 1A and 1B are a cut-away side depiction and a perspective depiction, respectively, of a light emitting assembly.
Figure 1B:
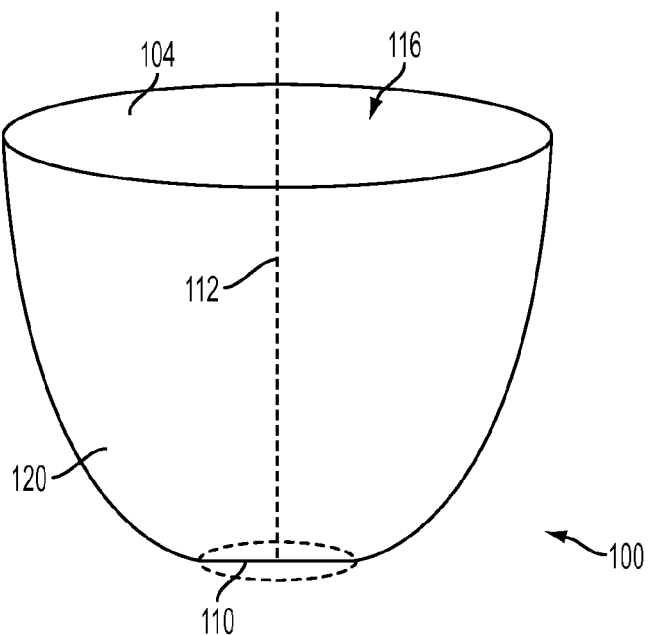

FIGS. 1A and 1B are a cut-away side depiction and a perspective depiction, respectively, of a light emitting assembly 100. The light emitting assembly 100 includes a light source 102 and a spectrum-shifting material 104. As illustrated, the light source 102 includes a hemispherical light emitting diode (LED) 106 and a lens 108. Without the presence of the lens 108, the light source 102 would emit light having a first spectral profile, such as blue light, hemispherically from the LED 106. However, the lens 108 is configured to direct the light as emitted from the hemispherical LED 106 generally about a plane 110 and generally away from an axis 112 orthogonal to the plane 110. As would be recognized according to mathematical conventions, the plane 110 may be understood to be an XY-plane and the axis 112 may be understood to be a Z-axis.

As illustrated, light 114 emitted from the light source 102 may have a first spectral profile and may be understood to have been emitted along the plane 110 even with angular displacement of some or all of the light from the plane 110. As illustrated, the light 114 is emitted from the light source 102 along an arc having a maximum of approximately a fifty (50) degree angle relative to the plane 110 and is nevertheless understood to have been emitted generally along the plane 110. In various examples, the light 114 from the light source may be understood to have been emitted generally along the plane 110 while having anything from a zero (0) degree angle deviation from the plane 110 to up to seventy-five (75) degrees of deviation or more. In various examples, the light 114 may be understood to have been emitted generally along the plane 110 when light is not emitted directly or substantially along the axis 112.

The spectrum-shifting material 104, in various examples, is or includes a phosphor or other material that may absorb and re-emit incident light with a second spectral profile different from the first spectral profile of the incident light. In various examples, the phosphor is or is embedded, suspended, or otherwise contained in a silicone, epoxy, or other material. In an example, as light 114 having the first spectral profile emitted from the light source 102 impacts individual phosphor molecules, the phosphor molecules absorb and re-emit the light 114 having the second spectral profile. Alternative spectrum-shifting materials 104 may shift the spectrum of incident light in alternative manners.

As illustrated, the spectrum-shifting material 104 substantially encircles the lights source 102. Thus, light 114 that is emitted generally along the plane 110 may be expected to impact the material 104. In various examples, the assembly may be designed so that all or essentially all of the light 114 from the light source 102 impacts the material 104 and is spectrum-shifted. As illustrated, some of the light 114 may be emitted from an opening 116 in the assembly 100 without having been spectrum-shifted. In various examples, such as the illustrated example, the assembly 100 may be designed to minimize or eliminate light 114 exiting the opening 116 that has not been spectrum-shifted. Additionally or alternatively, the assembly 100 may be designed to permit an allowable amount of un-shifted light 114 to pass through the opening 116.

As emitted from the spectrum-shifting material 104, the light 114 may be emitted from the opening 116 in the assembly 100 generally along the axis 112. The light 114 may be emitted from the spectrum-shifting material 104 either in fact or in effect through reflection from the spectrum-shifting material 104 or other structures of the assembly 100, as disclosed herein. As illustrated, the light 114 as emitted from the material 104 and out the opening 116 may be understood to be generally along the axis 112 without necessarily being parallel to the axis 112. In various examples, light 114 along the axis 112 may deviate from the axis 112 by ten (10) degrees or more, such as fifty (50) degrees or more, and still be understood to be generally along the axis 112. In various examples, the light 114 as emitted from the material 104 and as emitted from the assembly 100 through the opening 116 may not be parallel with the plane 110.

The spectrum-shifting material 104 may be in contact with or in close proximity of a reflective surface 118, such as of a housing 120 of the assembly 100. The reflective surface may provide, at least in part, the reflectance of the light 114 as emitted from the spectrum-shifting material 104. In an example, as phosphor molecules of the material 104 emit light as shifted to the second spectral profile, the light 114 as shifted may impact the reflective surface 118 and be reflected, such as generally along the axis 112 and out the opening 116, as illustrated. It is noted that individual photons of light 114 may be internally reflected (or re-emitted) within the assembly 100 until ultimately reflected (or re-emitted) along the axis 112 and out the opening 116. The reflective surface 118 may be made of any of a variety of metals or compounds with relatively high reflectance, such as white materials. In an example, at least one of the surface 118 and the housing 120 are a filled silicone material, such as polydimethlysiloxane having a filler such as titanium dioxide.

As illustrated, the spectrum-shifting material 104 and the reflective surface 118 are generally smooth. In various examples, the spectrum-shifting material 104 is matted or dimpled, such as may promote the admission of light into the material 104. In various examples, the reflective surface 118 is matted or dimpled, such as may promote an evening and/or direction of light from the reflective surface 118.

The reflective surface and/or the housing 120 generally may have a higher thermal conductivity than the material 104. In an example, the material 104 is a phosphor or a silicone that contains a phosphor that has a thermal conductivity of approximately 0.18 Watts per meter-degree-Celsius (W/(m ° C.)) while the reflective surface 118 and/or the housing 120 generally are made from a polymer material having a thermal conductivity of approximately 0.46 Watts per meter-degree-Celsius. In an alternative example, the housing 120 is made from a metal material having a thermal conductivity much higher than the polymer material, such as approximately one hundred (100) Watts per meter-degree-Celsius. Consequently, heat that is generated from the light 114 impacting the material 104 may tend to flow from the material 104 to the relatively more thermally conductive material of the reflective surface 118 and/or the housing 120. As a result, the assembly 100 generally may dissipate heat from the spectrum-shifting material 104 at a higher rate that may be the case if the material 104 is not in contact with relatively high thermally conductive material.

Figure 2:
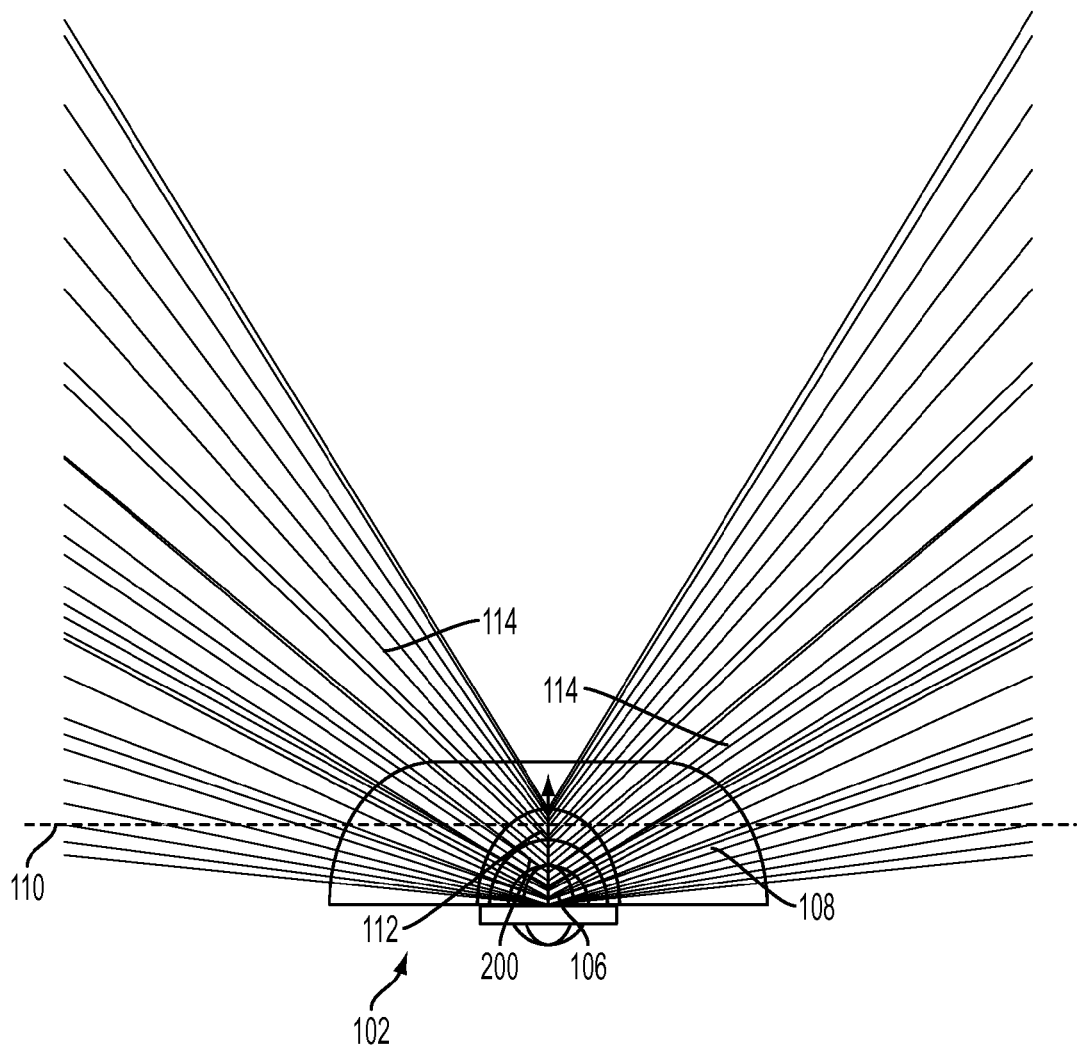
FIG. 2 is a detailed depiction of a light source.

FIG. 2 is a detailed depiction of the light source 102. The light source 102 includes the light emitter 106, as illustrated the hemispherical LED, and the lens 108. As shown in detail, while the light 114 as emitted from the light emitter 106 is emitted generally evenly in an arc about the axis 112, the lens 108 bends the light 114 away from the axis 112 so that the light is emitted generally about the plane 110. Consequently, the light 114 as emitted from the light source 102 generally is emitted about the plane 110 and is not emitted, in whole or in part, along the axis 112.

As illustrated, the light emitter 104 includes a native lens 200, such as may cause the light from an electronic LED embedded within the lens 200 to be emitted evenly about the arc. In such an example, the lens 108 may be a secondary lens that is positioned with respect to the light emitter 106 while the lens 200 is a primary lens of the light emitter 106. In various examples, the light emitter 106 and the lens 108 may be manufactured as unitary component, with the lens 108 providing the sole lens function.

Figure 3:
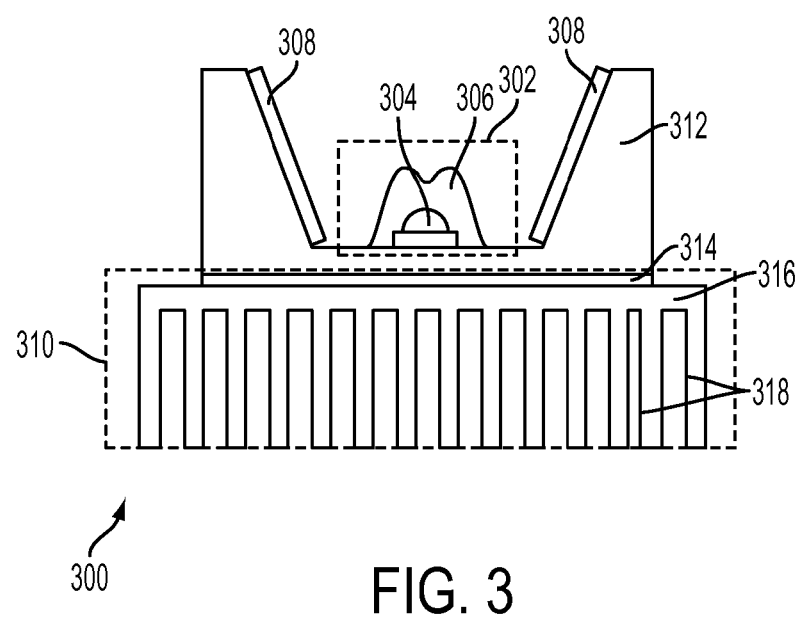
FIG. 3 is a light emitting assembly having a heat dissipation structure.

FIG. 3 is a light emitting assembly 300. The light emitting assembly includes a light source 302 that includes a light emitter 304 and a lens 306. The lens 306 includes an alternative configuration to that of the lens 108, though may similarly emit light substantially about the plane 110. The light emitter 304 may be the same or essentially the same as the light emitter 106. The spectrum-shifting material 308 may be the same or essentially the same as the spectrum-shifting material 104, as disclosed above, and may circumferentially surround the light source 302, as with the spectrum-shifting material 104.

The assembly 300 further includes a heat dissipation structure 310. As illustrated, the heat dissipation structure 310 is separate from but thermally coupled to the housing 312. Alternatively or additionally, the heat dissipation structure 310 may be an integral component of the housing 312. The housing 312 may, in various examples, be formed according to the structures and principles described above with respect to the reflective surface 118 and the housing 120.

In an example, the heat dissipation structure 310 includes a thermal interface material 314 thermally coupled to the housing 312 and a heat sink 316. In various examples, the heat sink 316 is a conventional heat sink that includes vanes 318 configured to increase the surface area of the heat sink 316 to promote heat dissipation to an environment of the heat sink 316. The heat sink 316 may be formed from a thermally conductive material, such as a metal, and may have a thermal conductivity of one hundred (100) Watts per meter-degree-Celsius or higher. The thermal interface material 314 may be configured to provide a transition between the thermal conductivity of the housing 312, such as the approximately 0.46 Watts per meter-degree-Celsius of the housing 120 above, and the thermal conductivity of the heat sink 316. In an example, the thermal interface material 314 is configured to reduce a thermal resistance between the housing and the heat sink. In an example, the thermal conductivity of the thermal interface material 314 is approximately two (2) Watts per meter-degree-Celsius or higher. In various examples, the thermal interface material 314 is a thermally conductive compound or grease, a thermally conductive adhesive, or a thermally conductive pad. The heat dissipation structure 310 may optionally be applied to any suitable assembly, such as the assembly 100 and to other assemblies, such as those disclosed in detail herein.

Figure 4:
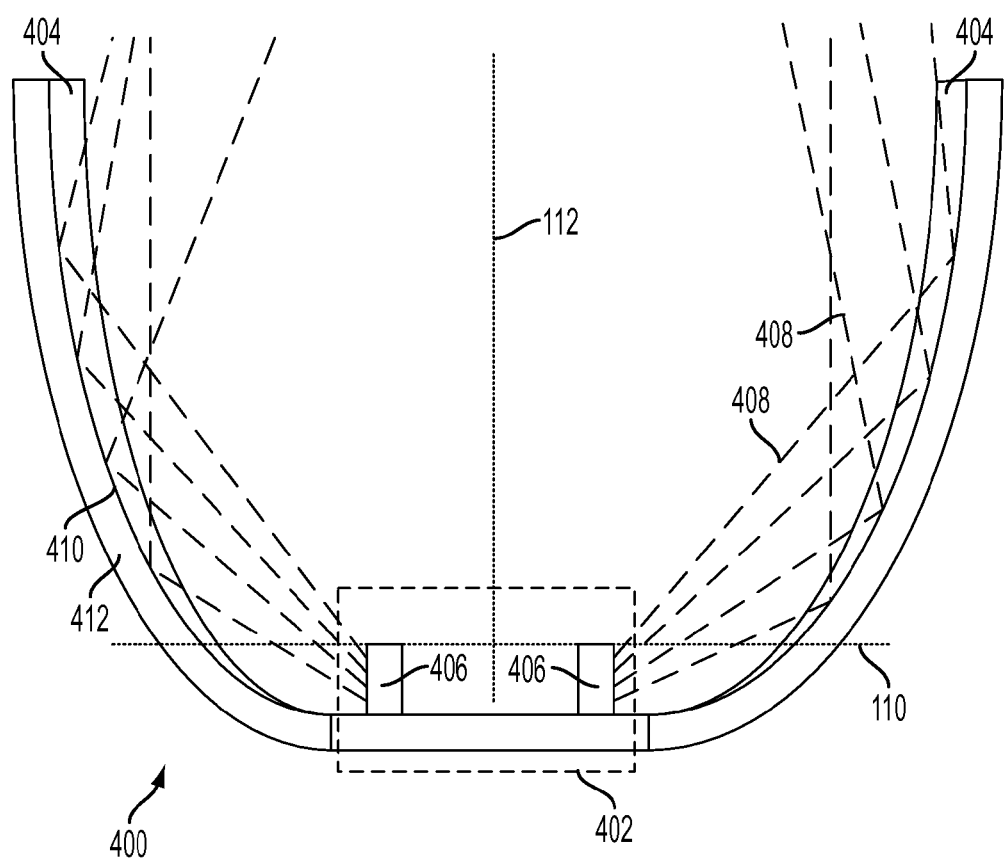
FIG. 4 is a light emitting assembly having side emitting LEDs.

FIG. 4 is a depiction of a light emitting assembly 400. The light emitting assembly 400 includes a light source 402 and a spectrum-shifting material 404. The light source 402 includes multiple side-emitting LEDs 406 configured to emit light 408 along the plane 110. Owing to the side emitting LEDs 406, a separate lens, such as the lens 108, may not be needed to redirect the light along the plane 110 and away from the axis 112, as in the assembly 100.

As illustrated, the spectrum shifting material 404 is positioned in contact with a reflective surface 410 and a housing 412. The reflective surface 410 and housing 412 may be constructed according to the materials and structures described with respect to the assemblies 100 and 300. A heat dissipation structure, such as the heat dissipation structure 310 or individual components thereof, may be applied to the assembly 400 to aid in heat dissipation, such as from the spectrum-shifting material 404.

Figure 5:
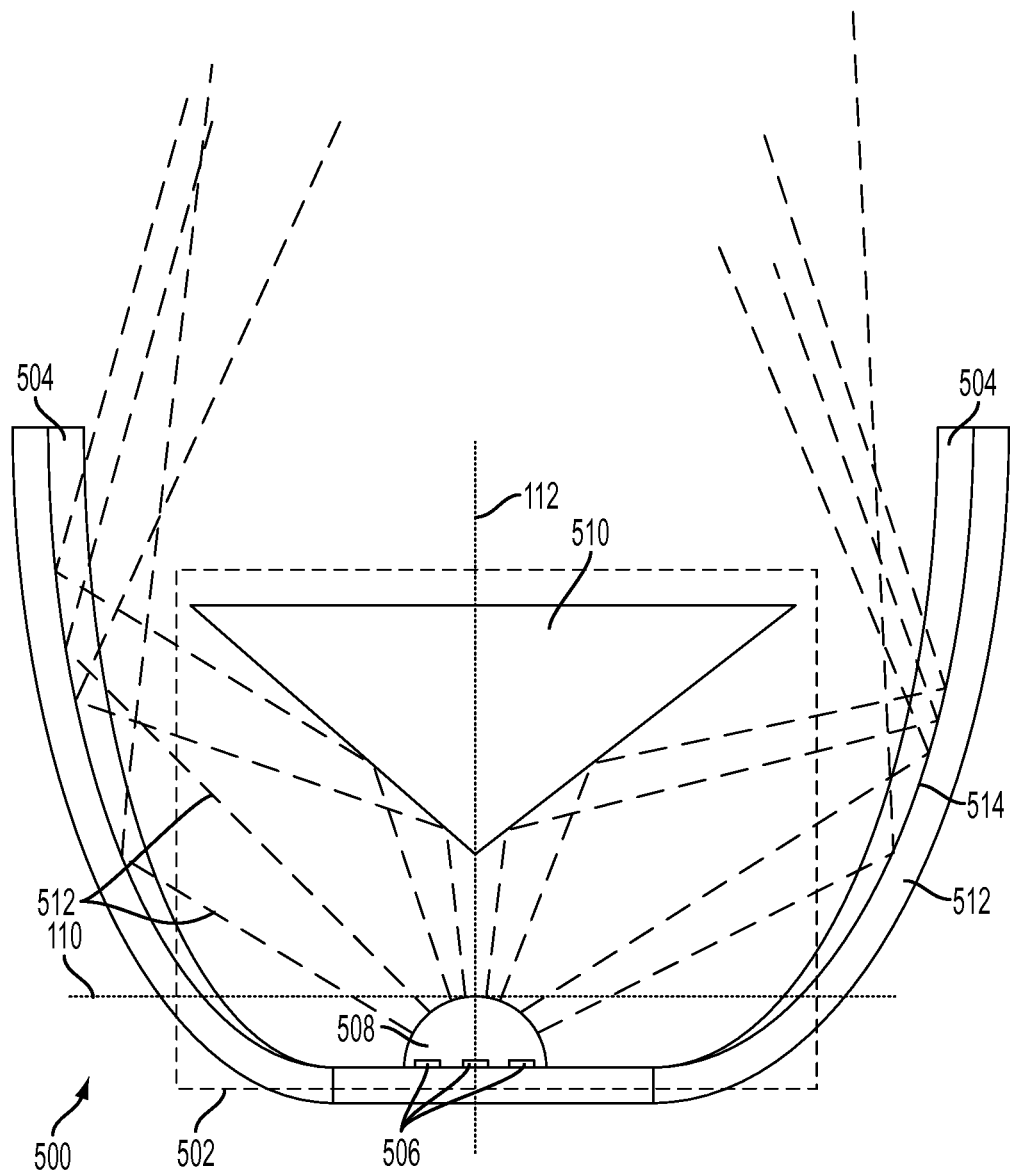
FIG. 5 is a light emitting assembly having a reflector.

FIG. 5 is a depiction of a light emitting assembly 500. The light emitting assembly 500 includes a light source 502 and a spectrum shifting material 504. The light source 502 includes multiple conventional LEDs 506 within a hemispherical lens 508. In an example, the LEDs 506 and lens 508 combine to form the light emitter 106 of FIGS. 1A, 1B, and 2. It is to be understood that while the LEDs 506 illustrate three (3) LEDs, any number of LEDs from one (1) or more may be utilized. The light source 502 further includes a reflector 510 or, in various examples, a prism suspended above the LEDs 506. The reflector 510 is configured to reflect or otherwise redirect light 512 so that the light as emitted from the light source 502 is generally about the plane 110. The reflector 510 may be a reflective material, such as the reflective material of the reflective surface 118 (FIG. 1A and 1B), or may be any of a variety of suitable materials, including glass where the reflector 510 is or is replaced with a prism. The reflector 510 may be coupled to the housing 512, either via a direct connection or by being suspended, such as with wire or other similar material.

As illustrated, the spectrum shifting material 504 is positioned in contact with a reflective surface 514 and the housing 512. The reflective surface 514 and housing 512 may be constructed according to the materials and structures described with respect to the assemblies 100, 300, and 400. A heat dissipation structure, such as the heat dissipation structure 310 or individual components thereof, may be applied to the assembly 500 to aid in heat dissipation, such as from the spectrum-shifting material 504.

Figure 6:
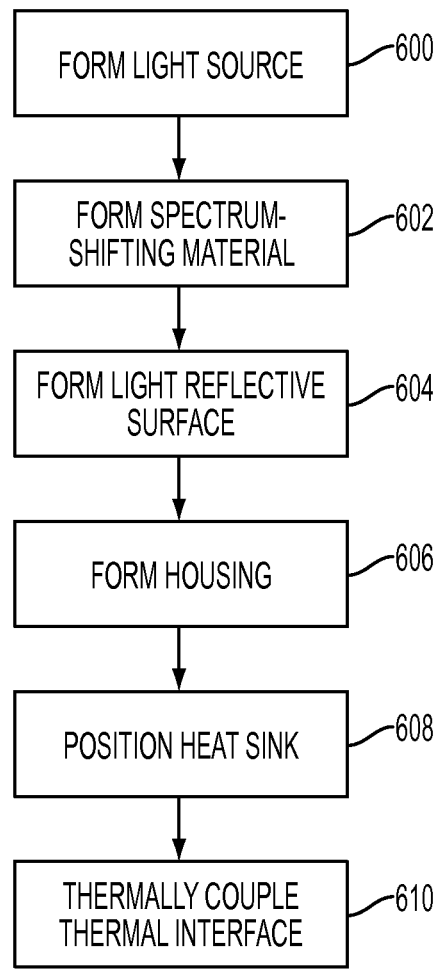
FIG. 6 is a method for making a light emitting assembly.

FIG. 6 is a method of making a light emitting assembly, such as the light emitting assemblies 100, 300, 400, 500, or other light emitting assemblies not specifically illustrated herein.

At 600, a light source configured to emit light substantially about a plane is formed, the light having a first spectral profile. The light source is oriented on a plane. In an example, forming the light source comprises positioning a light emitter configured to emit the light with respect to a lens configured to direct the light as emitted by the light emitter substantially about the plane. In an example, the light emitter is a hemisphere-emitting light emitting diode (LED). In an example, the light source is a side light emitter.

In an example, forming the light source comprises a positioning a light emitter configured to emit the light with respect to a reflector configure to direct the light as emitted by the light emitter substantially about the plane At 602, a spectrum-shifting material is formed with respect to the light source, the spectrum-shifting material being configured to shift light incident from the light source from the first spectral profile to a second spectral profile and emit light as shifted. The light, as shifted, is emitted from the assembly generally along an axis orthogonal to the plane. In an example, the material is a phosphor. In an example, the material is contained within a silicone composition. In an example, the material is formed as a layer that substantially encircles the light source.

At 604, a reflective surface is formed in substantial contact with and distal to the material relative to the light source, wherein the reflective surface is configured to reflect the light as shifted by the material along the axis. In an example, the material is further configured to reflect light as shifted along the axis.

At 606, a housing is formed from a housing material having a thermal conductivity greater than that of the spectrum-shifting material and configured to conduct heat energy from the spectrum-shifting material. In an example, the housing is formed from at least one of a metal and a filled silicone. In an example, the reflective surface is formed as a part of the housing.

At 608, a heat sink is optionally positioned and thermally coupled to the housing and configured to dissipate, at least in part, heat from the housing and the spectrum-shifting material. In an example, the heat sink has a thermal conductivity different than the thermal conductivity of the housing.

At 610, a thermal interface is optionally thermally coupled between the housing and the heat sink, the thermal interface having a thermal conductivity between that of the housing and the heat sink.

What is claimed is:

1. A light emitting assembly, comprising:
   a light source configured to emit light substantially about a the plane, the light having a first spectral profile; and
   a material configured to shift light incident from the light source from the first spectral profile to a second spectral profile and emit light as shifted, wherein the material is or includes a phosphor, the material forms a layer that substantially encircles the light source about the plane, and the material is a spectrum-shifting material;
   wherein the light, as shifted, is emitted from the assembly generally along an axis orthogonal to the plane;
   wherein the light source comprises a light emitter configured to emit the light and a reflector configured to re-direct the light as emitted by the light emitter substantially about the plane,
   a reflective surface in substantial contact with and distal to the spectrum-shifting material relative to the light source, wherein the reflective surface is configured to reflect the light as shifted by the spectrum-shifting material along the axis, and
   a housing formed from a housing material having a thermal conductivity greater than that of the spectrum-shifting material and configured to conduct heat energy from the spectrum-shifting material, and wherein the housing material is a filled silicone and the reflective surface is a part of the housing.

2. The assembly of claim 1, wherein the light source comprises a light emitter configured to emit the light and a lens configured to direct the light as emitted by the light emitter substantially about the plane.

3. The assembly of claim 2, wherein the light emitter is a hemisphere-emitting light emitting diode (LED).

4. The assembly of claim 1, wherein the light source is a side light emitter with respect to the axis.

5. The assembly of claim 1, wherein the material is contained within a silicone composition.

6. A method for making a light emitting assembly, comprising:
   forming a light source configured to emit light substantially about a plane, the light having a first spectral profile; and
   forming a spectrum-shifting material with respect to the light source, the spectrum-shifting material being configured to shift light incident from the light source from the first spectral profile to a second spectral profile and emit light as shifted, wherein the spectrum-shifting material is or includes a phosphor, and wherein the spectrum-shifting material forms a layer that substantially encircles the light source about the plane;
   wherein the light, as shifted, is emitted from the assembly generally along an axis orthogonal to the plane;
   wherein forming the light source comprises positioning a light emitter configured to emit the light with respect to a reflector configured to re-direct the light as emitted by the light emitter substantially about the plane and further comprising forming a reflective surface in substantial contact with and distal to the spectrum-shifting material relative to the light source, wherein the reflective surface is configured to reflect the light as shifted by the spectrum-shifting material along the axis, and forming a housing from a housing material having a thermal conductivity greater than that of the spectrum-shifting material and configured to conduct heat energy from the spectrum-shifting material, wherein the housing is formed from a filled silicone and the reflector is a part of the housing.

7. A light emitting assembly, comprising:
   a light source oriented on a plane, and configured to emit light substantially away from an axis orthogonal to the plane, the light having a first spectral profile; and
   a material configured to shift light incident from the light source from the first spectral profile to a second spectral profile and emit light as shifted, wherein the material is or includes a phosphor, and wherein the material is a spectrum-shifting material and forms a layer that substantially encircles the light source about the plane,;
   wherein the light, as shifted, is emitted from the assembly generally along an axis orthogonal to the plane;
   wherein the light source comprises a light emitter configured to emit the light and a reflector configured to re-direct the light as emitted by the light emitter substantially about the plane and
   further comprising a reflective surface in substantial contact with and distal to the spectrum-shifting material relative to the light source, wherein the reflective surface is configured to reflect the light as shifted by the spectrum-shifting material along the axis, and a housing formed from a housing material having a thermal conductivity greater than that of the spectrum-shifting material and configured to conduct heat energy from the spectrum-shifting material, wherein the housing is formed from a filled silicone and the reflective surface is a part of the housing.

8. The assembly of claim 7, wherein the light source comprises a light emitter configured to emit the light and a lens configured to direct the light as emitted by the light emitter substantially about the plane.

9. The assembly of claim 8, wherein the light emitter is a hemisphere-emitting light emitting diode (LED).

10. The assembly of claim 7, wherein the light source is a side light emitter with respect to the axis.

11. The assembly of claim 7, wherein the material is contained within a silicone composition.

12. The assembly of claim 7, wherein the reflective surface is a part of the housing.

* * * * *